United States Patent [19]
Wallace

[11] Patent Number: 5,739,913
[45] Date of Patent: Apr. 14, 1998

US005739913A

[54] NON-CONTACT EDGE DETECTOR

[75] Inventor: John D. Wallace, Newburyport, Mass.

[73] Assignee: MRS Technology, Inc., Chelmsford, Mass.

[21] Appl. No.: 693,469

[22] Filed: Aug. 2, 1996

[51] Int. Cl.$^6$ .................................................. G01B 11/00
[52] U.S. Cl. ........................................................ 356/401
[58] Field of Search ................................. 356/372, 373, 356/374, 375, 376, 381, 399–401; 250/548, 559.22, 559.27

[56] References Cited

U.S. PATENT DOCUMENTS

| | | |
|---|---|---|
| Re. 31,143 | 2/1983 | Kaye et al. . |
| 3,187,185 | 6/1965 | Milnes ........................... 356/381 |
| 3,737,856 | 6/1973 | Lehrer et al. . |
| 3,764,218 | 10/1973 | Schedewie . |
| 3,976,382 | 8/1976 | Westby . |
| 4,070,575 | 1/1978 | Park et al. . |
| 4,165,178 | 8/1979 | Coumo, Jr. et al. . |
| 4,538,909 | 9/1985 | Bible et al. . |
| 4,741,622 | 5/1988 | Suwa et al. . |
| 4,852,079 | 7/1989 | Kinney et al. . |
| 4,872,757 | 10/1989 | Cormack et al. . |
| 4,880,348 | 11/1989 | Baker et al. . |
| 4,907,035 | 3/1990 | Galburt et al. . |
| 4,991,967 | 2/1991 | Creighton ........................... 356/376 |
| 5,039,861 | 8/1991 | Swenson . |
| 5,115,142 | 5/1992 | Taguchi et al. . |
| 5,168,304 | 12/1992 | Hattori . |
| 5,187,375 | 2/1993 | Masten . |
| 5,194,743 | 3/1993 | Aoyama et al. . |
| 5,229,811 | 7/1993 | Hattori et al. . |
| 5,278,634 | 1/1994 | Skunes et al. . |
| 5,280,171 | 1/1994 | Halter . |
| 5,294,803 | 3/1994 | Pahr . |
| 5,307,154 | 4/1994 | Naemura et al. . |
| 5,377,251 | 12/1994 | Mizusawa et al. . |
| 5,443,152 | 8/1995 | Davis . |
| 5,481,298 | 1/1996 | Sasaki et al. . |
| 5,502,890 | 4/1996 | Günter . |
| 5,648,854 | 7/1997 | McCoy et al. ........................... 356/399 |

FOREIGN PATENT DOCUMENTS 0 164 165   12/1985   European Pat. Off. .

*Primary Examiner*—K. Hantis
*Attorney, Agent, or Firm*—Hamilton, Brook, Smith & Reynolds, P.C.

[57] ABSTRACT

A non-contact substrate alignment system for a lithography system is disclosed that comprises three substrate edge detectors. Each edge detector comprises a projector, preferably located above the substrate, that projects a light field down onto a substrate and a stage. The light field has a predetermined shadow line that is straight and runs perpendicularly to the direction of the substrate's edge. A camera is also located above the substrate and detects the light from the light field. The height differential between the substrate and stage causes a shift in the shadow line from the perspective of the camera. A controller connected to the camera utilizes this shift to locate the edge of the substrate. The problems associated with the mechanical banking techniques are thus avoided. Moreover, the technique uses detectors and projectors that can be located entirely above the substrate; specially designed stages with incorporated detectors or projectors are not required. The technique is also very tolerant of different types of substrates with different edge characteristics.

20 Claims, 6 Drawing Sheets

NON-CONTACT EDGE DETECTOR

GOVERNMENT SUPPORT

This invention described herein was supported in whole or in part by Contract No. F33615-92-C-5805 from the Advanced Research and Projects Agency (ARPA).

BACKGROUND OF THE INVENTION

Lithography systems are used to project patterns onto a photo-sensitive material on a substrate. In the manufacture of integrated circuits, the photo-sensitive material is termed a photoresist, and the substrates are usually wafers in the case of semiconductor chip production or glass sheets, or similar transparent material, in the case of flat panel display production.

After the photoresist has been exposed, the substrate is removed from the lithography System, and the photoresist is developed. The developing process strips away the photoresist according to the projected pattern to selectively lay bare the substrate. This allows the selective processing of the substrate's surface. A new material layer may be deposited; or the exposed substrate may be chemically reacted, such as through oxidation or etching. These processes can involve baking and annealing the substrate along with physical manipulation such as spinning or cleaning, which can physically distort the substrate to varying degrees. Later, the remaining photoresist is stripped away.

The exposure-development-processing is repeated a number of times because features on a chip or display comprise many layers of different materials. The patterns formed in each of these layers must be precisely aligned with respect to each other. To achieve this requirement, the substrate is supported on a movable and slightly rotatable stage under the projection system during exposure. The stage positions the substrate accurately enough relative to a projection system so that each successive pattern is exposed on the photoresist precisely overlaying the previously patterned layers.

Positioning of a substrate prior to exposure is usually done in two steps: a pre-align step and a fine-align step. In the pre-align step, the substrate is often banked against a mechanical reference on the stage, one example being steel pins. The substrate is then held in place on the stage by a vacuum. In the subsequent fine-align step, an optical alignment system aligns the previously imaged patterns on the substrate to the projection system to a very high degree of accuracy by reference to alignment marks on the substrate. It is essential during pre-alignment that the substrate location be repeatable to well within the capture range of the fine-alignment system and that the rotation of the plate with respect to the stage be small enough that it can be corrected by rotating the stage.

The use of a mechanical stop, such as pins, for the pre-alignment of substrates has certain drawbacks. Often the substrates are coated with resist out to and slightly beyond their edges. Over time, resist can come off the substrates and build up on the pins, causing inconsistent alignment. Moreover, some pins have ball-bearing rollers to allow the substrates to smoothly glide against the pins. Resist can get into the ball bearings and cause the rollers to jam. Pin pre-alignment techniques also tend to be intolerant of variability in the substrates during production. Etching and baking can curl the edges of the substrates. The edges can catch on a pin and prevent the substrate from being held in place by the vacuum. The edge may even go over the pin completely. Also, the possibility exists that mechanical contact between a substrate and a stop such as a pin will cause damage to the substrate, resulting in bad alignment or worse. Pin pre-alignment systems also tend to be mechanically complex. To sense whether the substrate has been properly banked against the pins, a switch or other sensor must be built into each pin. This system also places requirements on how the substrate is placed on the stage. To bank a substrate properly, lateral force must be applied to the substrate to push it against the pins. The substrate may catch on the pins if this force is too high and may move away from the pins and not be detected by the banking sensors if the force is too low.

Transmissive optical sensors can be used for pre-alignment as an alternative to mechanical stops in wafer handlers. In the simplest manifestation, a light source located on the stage shines upward and illuminates a detector. Conversely, a light source above can shine down to a detector on the stage. When the substrate begins to intercept the beam, the position of the substrate on the stage is known. A problem here, however, is that the light source or detector must be located above the stage and fixed in relationship, i.e., attached, to it. This requires a bracket protruding up from the stage that can interfere physically with the projection system as well as with the fine-alignment system and other instruments. In addition, if the substrate is transparent, the detector will be flooded with light whether or not the substrate intercepts the beam, defeating the pre-alignment attempt.

A disadvantage that the transmissive optical sensing technique shares with mechanical pins is that they are both fixed with respect to the stage, thus allowing the edge of the substrate to be aligned only to one position. If the substrate size is changed in order to manufacture a different sort of chip or display, then the substrate will likely no longer lie at an optimum location for the light source and detector system. When the system is designed to have movable optical sensors or pins to handle different substrate sizes, frequent manual adjustment can be required, and/or the system becomes overly complex.

Another pre-alignment technique involves sensing the position of the substrate using alignment mark sensors mounted on a separate pre-alignment platform. Because the substrate position is determined relative to the platform, the substrate is simply moved a calculated amount after pre-alignment to properly position the substrate for fine-alignment, rather than having to mechanically bank the substrate as before. The problem with this sensing method is that variations in substrate material (for example, transparent glass versus opaque silicon), in coating material (chrome vs. aluminum vs. low-reflection resists, etc.), can hide the alignment marks from the detectors. Moreover, the alignment marks are only present after the first etching cycle.

SUMMARY OF THE INVENTION

The present invention is directed to a non-contact technique for locating the substrate. The problems associated with the mechanical banking techniques are thus avoided. Moreover, the technique uses detectors and projectors that can be located entirely above the substrate; specially designed stages with incorporated detectors or projectors are not required. The technique is also very tolerant of different types and sizes of substrates with different edge characteristics.

In general, according to one aspect, the invention features a substrate edge detector for a lithography system. It comprises a projector, preferably located above the substrate, that projects a light field down onto a substrate and a stage. The light field has a predetermined shadow line. In the preferred embodiment, this shadow line is straight and runs perpendicularly to the direction of the substrate's edge. A camera is also located above the substrate and detects the light from the light field. The height differential between the substrate and stage causes a shift in the shadow line from the perspective of the camera. A controller connected to the camera utilizes this shift to locate the edge of the substrate.

In specific embodiments, the projector comprises a light stopped source of light and projection optics that form an image of an edge of the light stop onto the substrate and stage to form the shadow line. An optical axis of the projector may lie in a plane that is perpendicular to the substrate and stage and contains the edge of the substrate. It is preferred that the optical axis is shifted slightly out of the plane away from the substrate. This hides a halo or penumbra on the stage, which is caused by the substrate's edge, from the camera's view. The optical axis of the camera preferably lies substantially in the plane. The projector and camera axes are angled from the vertical and intersect near to the substrate edge such that projected light reflected at the edge is received by the camera. The angle of inclination of the projector, however, is different than the angle of inclination of the camera, so that the camera does not receive specularly reflected light from the substrate's top surface which could saturate a detector.

In other specifics of the embodiments, the controller identifies the shift in the shadow line by summing pixels along a direction that is orthogonal to the shadow line incrementally over at least a portion of the shadow line's length. The changes in intensity are indicative of the edge's location.

The invention is also applicable to substrate alignment systems comprising preferably three of the edge detectors.

In general, according to another aspect, the invention features a method for detecting an edge of a substrate. This method comprises projecting a light field onto a substrate and creating a predetermined shadow line in the light field. An image of the light field is then detected and a location of the edge of the substrate determined by identifying shifts in the shadow line caused by a height differential between the substrate and a stage.

According to another aspect, the invention features a substrate alignment system for a lithography device. The system comprises at least three substrate edge detectors. Each detector is attached to an alignment platform above the substrate and stage. And, each detector comprises a projector that projects a light field onto the substrate and the stage, the light field having a predetermined shadow line. A camera detects light from the light field to generate an image of the light field. A controller is used to locate the substrate by reference to the images from the separate cameras of the edge detectors by reference to the respective shadow lines.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENT

Figure 1:
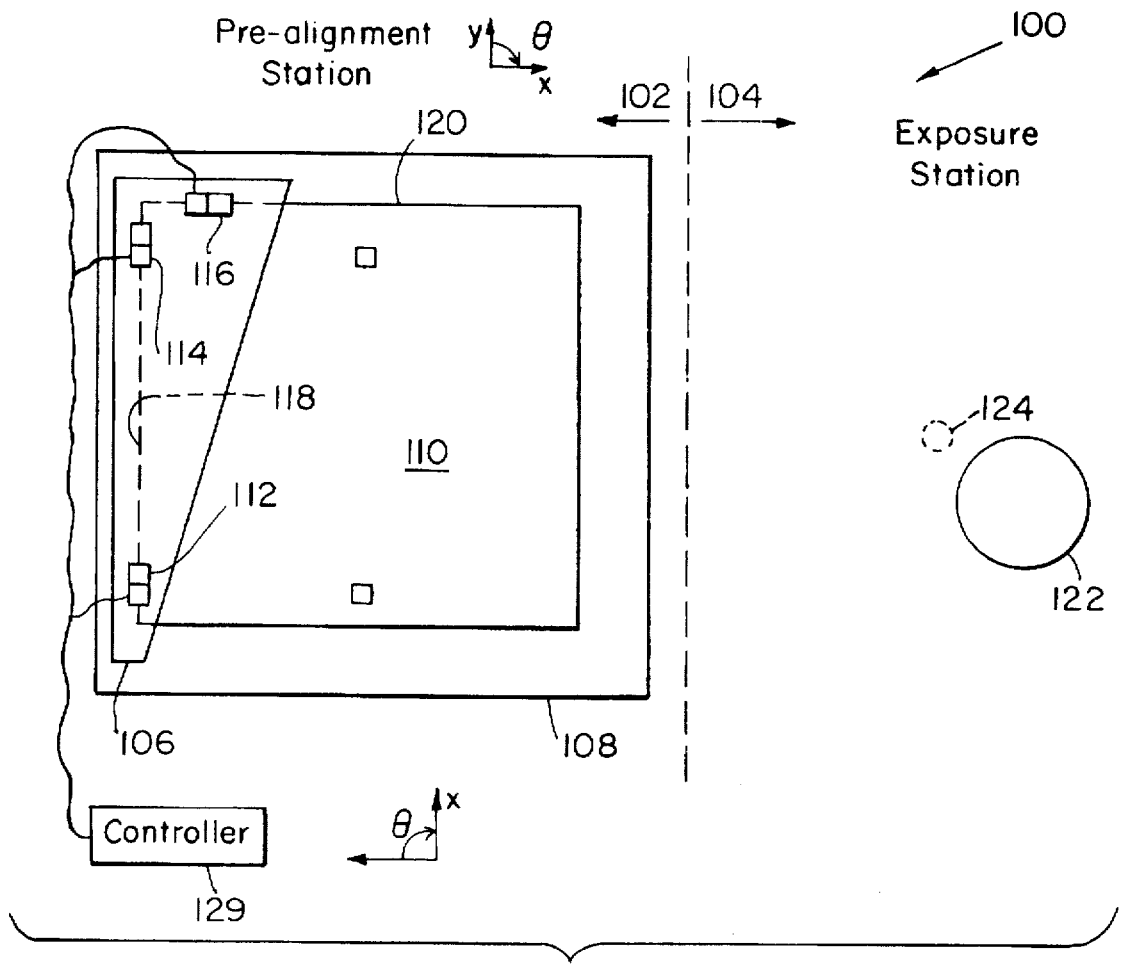
FIG. 1 is an overhead plan view of a pre-alignment system of the present invention.

FIG. 1 shows a pre-alignment system 100 of the present invention. The system comprises an alignment station 102 that may be separated from a projection station 104 where the substrate is exposed.

The alignment station 102 comprises a pre-alignment or sensor platform 106 that is located above a stage 108 on which a substrate 110 is held. The pre-alignment platform carries preferably three substrate edge detectors 112, 114, 116. A first and second of these edge detectors 112, 114 detect a common edge 118 of the substrate 110, but at different locations along that edge. The third edge detector 116 detects the location of an orthogonal edge 120. These three detectors 112, 114, 116 feed information to a controller 129 that determines the position of the substrate in the x,y coordinate system and the angle θ of the substrate 116.

The projection station comprises a projection system 122, and possibly an off-axis fine-alignment sensor 124. Alternatively, fine alignment may be performed with sensors on the alignment platform using remote alignment techniques. U.S. Patent Application Ser. No. 08/692,290 (refiled as Ser. No. 08/733,810) filed by Shepard Johnson, et al. on the same day as the instant application, entitled Lithography System with Remote Multisensor Alignment, describes the application of the present invention to remote alignment techniques. The teachings of this application are incorporated herein in their entirety by this reference. In either case, while at the projection station, the substrate 110 is successively stepped by the stage through a series of exposures underneath the projection system 120.

Figure 2:
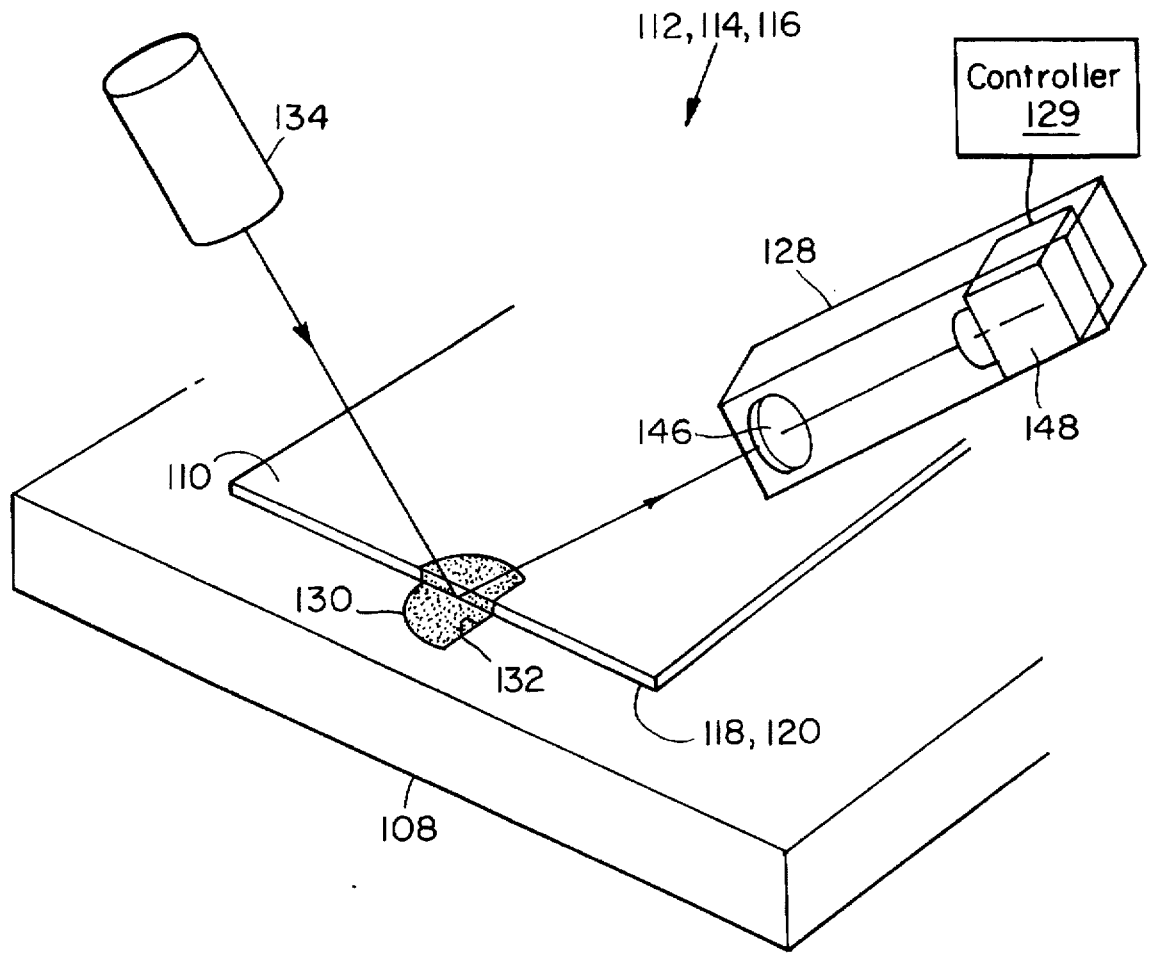
FIG. 2 is a schematic perspective view of a non-contact substrate edge detector of the present invention.

FIG. 2 shows a non-contact substrate edge detector 112, 114, 116 that has been constructed according to the principles of the present invention.

The edge detector 112, 114, 116 comprises a light projector 134 that projects a field of light 130 down onto a point of interest on the stage 108 and substrate 110. This light field illuminates both a section of the stage, a segment of the substrate's edge, and a portion of the substrate. The light field 130 is bounded on at least one side by a predetermined edge pattern or shadow line 132, beyond which there is no light. This edge pattern 132 is preferably a straight edge that is perpendicular to the substrate edge 118, 120.

A camera 128 is positioned to detect the light field 130 projected onto the substrate and stage. The camera 128 includes an imaging lens 146 that forms an image of the light field 130 on a charged-coupled device (CCD) array 148. For clarity, the superstructure that connects the projector 134 and camera 128 to the pre-alignment or alignment platform 106 is not shown.

Figure 3:
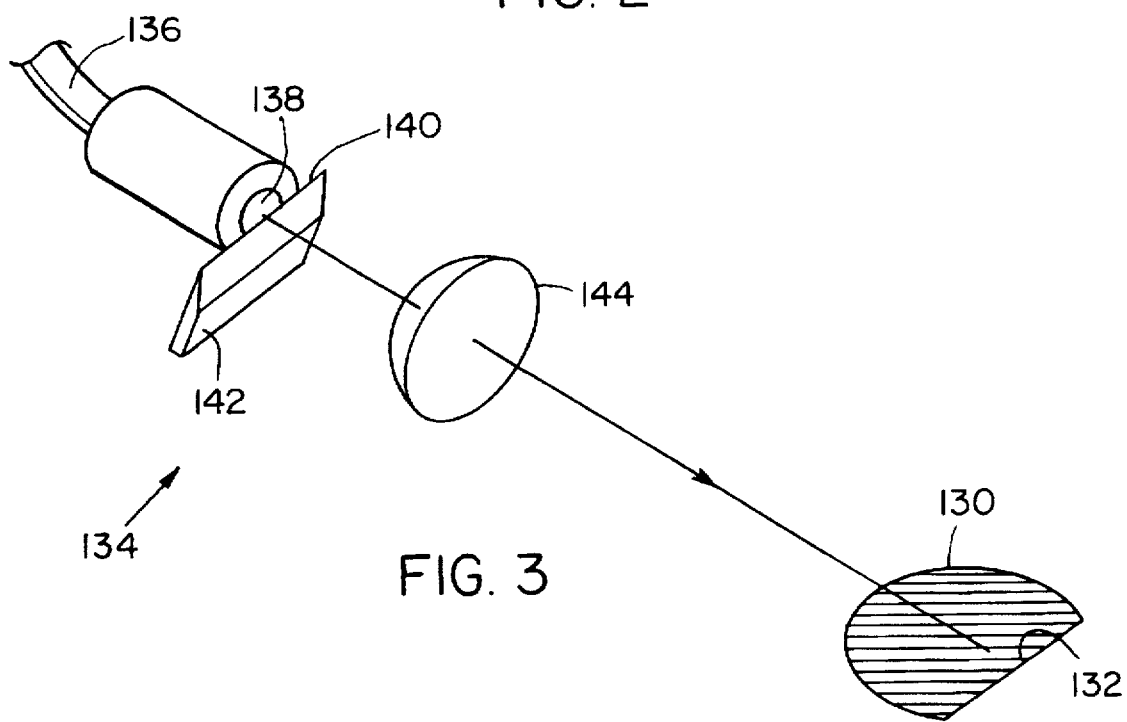
FIG. 3 is a schematic perspective view showing the construction of the projector and the light field with the shadow line.

FIG. 3 shows one embodiment of the projector 134. An optical fiber 136, transmitting light from a source not shown, has a proximal end that is partially blocked by a straight edge 140 of a light stop 142. A projection lens 144 is used to form an image of the end 138 of the fiber and straight edge 140 on the plane of the stage 108. The optical characteristics should be chosen so that the image of the straight edge remain sharply focused through a vertical range large enough to encompass the top of the stage 108 and the upper surface of the substrate 110, taking into account any variability in the height of the stage.

Figure 4:
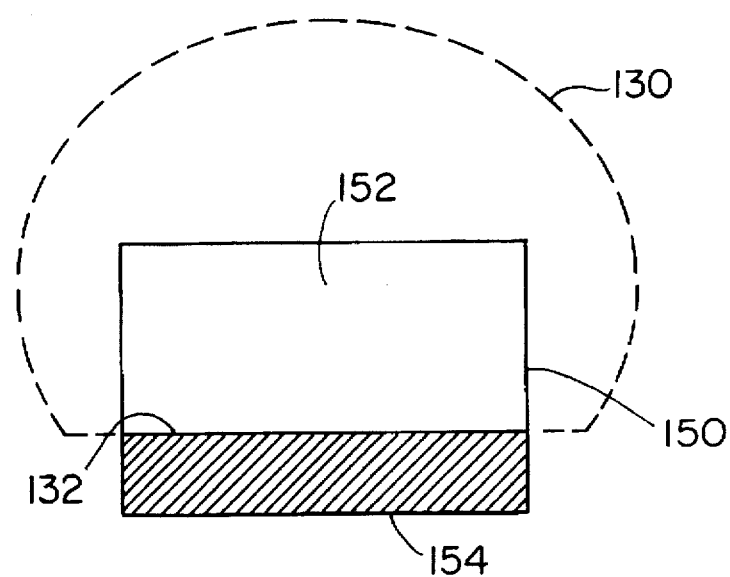
FIG. 4 is a plan view showing the field of view of the camera relative to the light field.

FIG. 4 shows the region of the light field 130 and shadow line 132 that is detected by the camera 128. Specifically, the field of view of the camera 128 and its position are adjusted so that it views a rectangular region 150 extending across the shadow line. The long axis of the rectangular field of view 150 is preferably parallel to the shadow line 132. The field of view 150 includes a section 152 of the light field and a dark section 154 that extends beyond the shadow line 132.

Figure 5A:
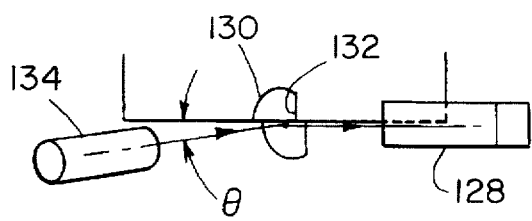
FIGS. 5A and 5B are a top plan and side view showing the angular relationship of the projector and camera relative to the substrate and stage.
Figure 5B:
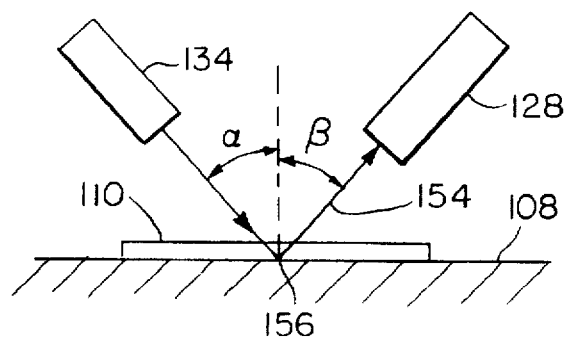

FIGS. 5A and 5B show the angular relationship between the projector 134 and camera 128. The optical axis 154 of the camera 128 extends from the point of interest 156 at an angle $\beta$ and preferably lies in a plane that is perpendicular to the stage 108 and that includes the nominal edge position 118, 120 of the substrate 110. The projector 134 is also directed at the point of interest 156. The optical axis of the projector 134, while being near the perpendicular plane of the substrate edge, is angularly offset by a small angle $\theta$. The resulting light field 130 is elliptical and truncated by the straight shadow line 132.

Because this edge detector 112, 114, 116 uses diffuse light and because the substrate 110, except for any bevel on its edge, is typically a specular reflector, the angle $\beta$ should be set at either greater or less than the angle $\alpha$. Also, the projector is shifted out of the vertical plane by the angle $\theta$ to move a penumbra out of the view of the camera. This penumbra can be created by light passing through bevels on the substrate's edges, and being diffusely reflected by the stage. The penumbra of light can otherwise blur the division between the dark and light along the edge of the substrate. Tilting of the projector by the angle $\theta$ shifts the penumbra so that it is no longer seen from the perspective of the camera.

Figure 6A:
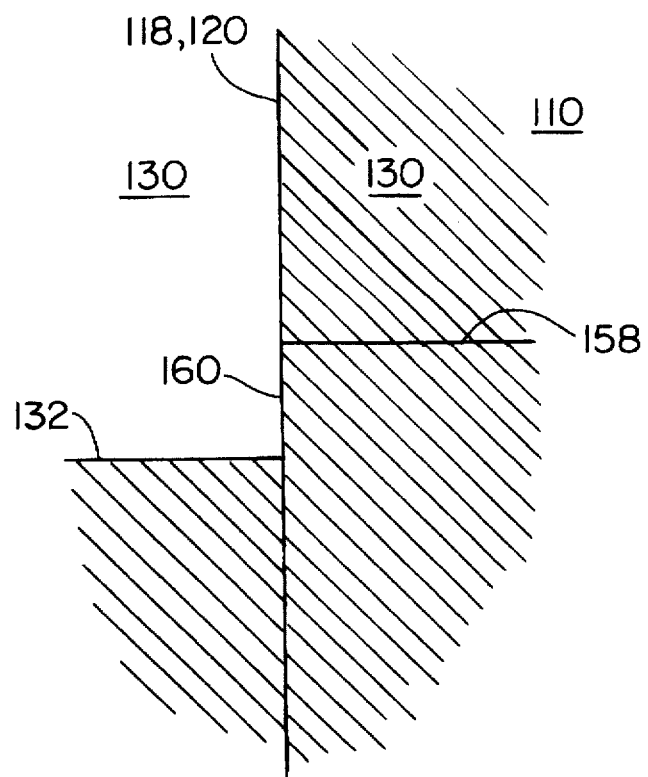
FIGS. 6A, 6B, 6C, and 6D are a top view, a side view, a camera perspective view, and a summed pixel column intensity plot of the light field and shadow line created on the substrate and stage.

FIG. 6A shows a top view of the light field 130 and shadow line 132. The effect of the substrate's height above the stage has the effect of shifting the portion 158 of the shadow line 132 that impinges on the substrate 110 towards the projector 134 and away from the camera 128. A step or jog 160 is created due to this discontinuity.

Figure 6B:
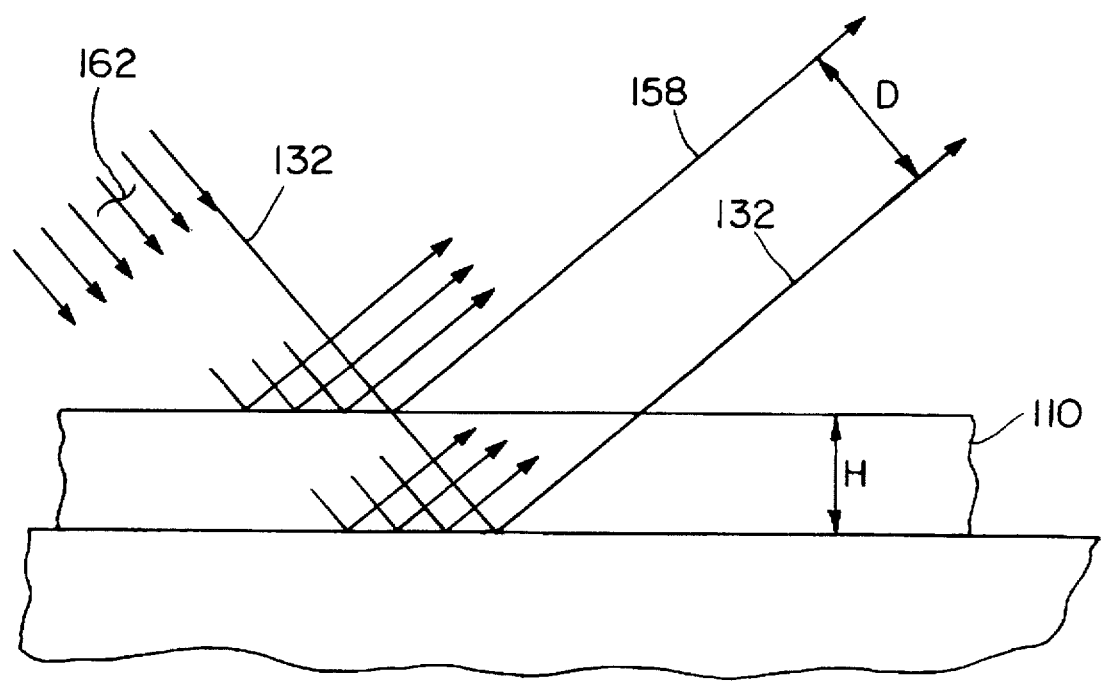

The side view of FIG. 6B shows how the step effect is created. The incoming light beam 162 from the projector 134 has a top edge that is defined by the shadow line 132. The effect of the substrate 110 is to shift the shadow line 158 that falls on the portion of the substrate 110, in this case upward, by an amount D which is proportional to the thickness of the substrate 110.

Figure 6C:
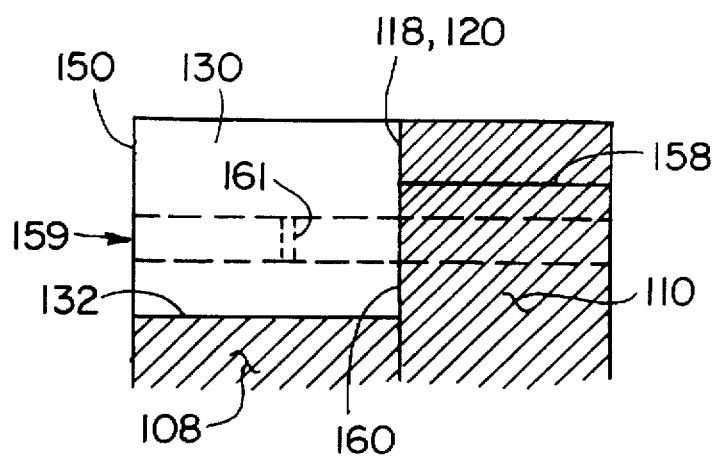

FIG. 6C shows the light field 130 within the camera's field of view 150. The image is similar to the top view of FIG. 6A except that the step 160 is somewhat larger due to the camera's inclination. Of note is the fact that the portion of the substrate above the shadow line is dark. This is due to the fact that the differing angles $\alpha$ and $\beta$ of the projector 134 and camera 128, respectively, that do not allow specularly reflected light into the camera. A diffusively reflecting, opaque substrate would have the effect of brightening the area on the substrate above the shadow line 158.

Figure 6D:
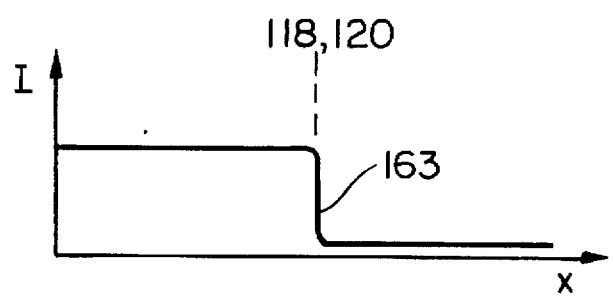

The controller 129 receives the image shown in FIG. 6C as pixel picture information from the cameras 128. The controller 129 uses a defined horizontal band 159 that runs perpendicularly to the substrate edge 118, 120 and contains an illuminated portion of the stage 108 on one side and a shadowed portion of the substrate 110 on the other. One picture processing technique that allows the controller 129 to pick out the location of the edge 118, 120 is to sum each pixel column, see reference numeral 161 for example, within the horizontal band 159. The intensity verses spatial position plot in FIG. 6D represents the intensity of the summed pixel columns across the horizontal band 159. The edge is indicated by the pixel columns that exhibit a sharp drop in intensity. The advantage of summing pixel columns rather than analyzing a single row of pixels is that a single pixel error will not cause an error in position.

The controller 129 locates the position of the edge 118, 120 in the x-axis by finding the location of the sharp drop in intensity 163 representing the change from the illuminated portion of stage 108 to the shadowed portion of the substrate 110. Since the edge detection optics are precisely located, the position of the edge is then known. The substrate can be moved to a position within a capture range defined by the length of the shadow line 132 within the camera's field of view.

Figure 7A:
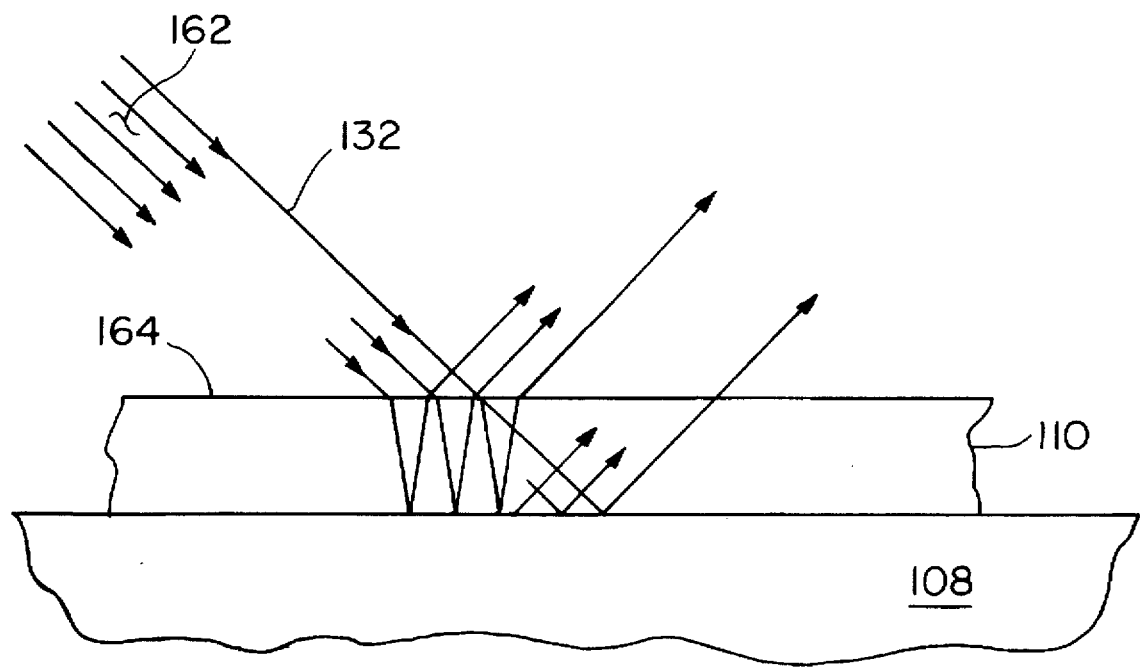
FIGS. 7A and 7B are a side and camera perspective view of the light field for a transparent substrate.

FIG. 7A shows a side view when the light field 130 is projected onto a transparent substrate 110. The incoming light 162 from the projector, bounded on the top by the shadow line 132, strikes the top planar surface 164 of the transparent substrate 110 and is refracted downward at a steeper angle due to the higher index of refraction of the substrate 110 relative to the air. The light passing through the substrate 110 is diffusely reflected back upwards by the stage 108.

Figure 7B:
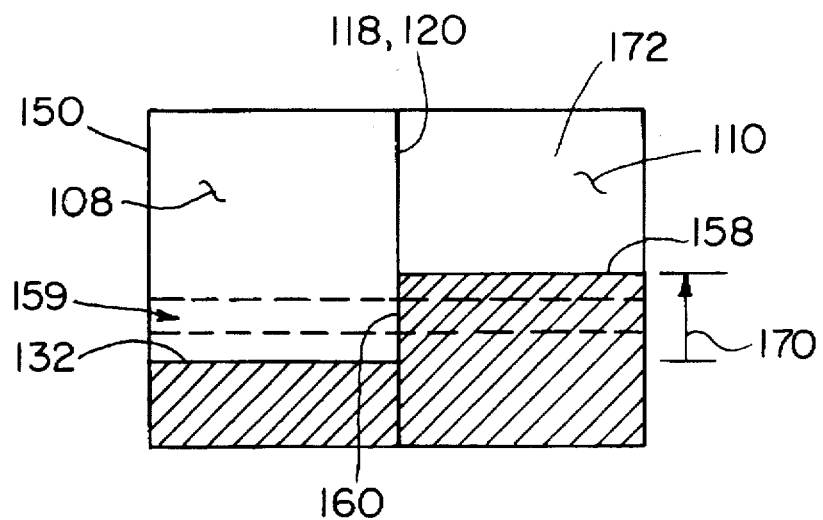

As shown in FIG. 7B, the position of the shadow line 132 from the perspective of the camera is still shifted upward but simply not to the degree that occurs with opaque substrates. Thus, for a horizontal band 159 of the camera's image, there is still a portion of the substrate edge 118, 120 that bounds an illuminated area on one side and a dark area on the other. Note, that in contrast to the specularly reflecting substrate, there is now an area 172 of the substrate above the shadow line section 158 from the perspective of the camera that is illuminated due to the combined effect of the transparency of the substrate 110 and the diffuse reflection from the stage 108.

Figure 8:
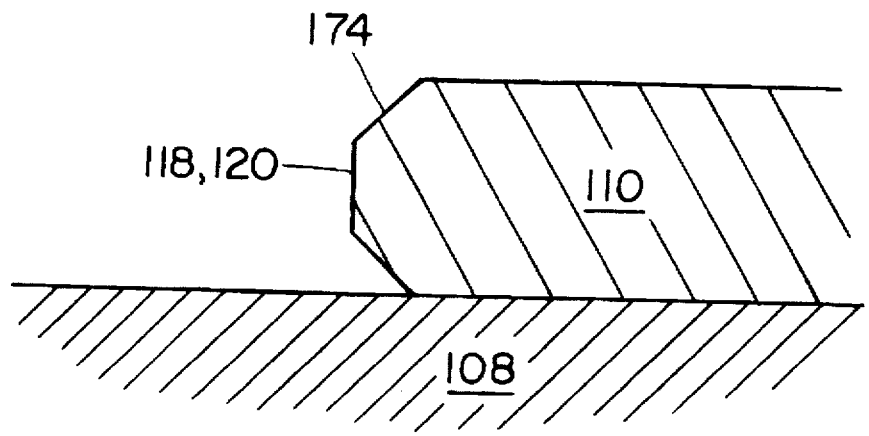
FIG. 8 is a vertical cross-sectional view of a beveled edge of a substrate located on the stage.
Figure 9:
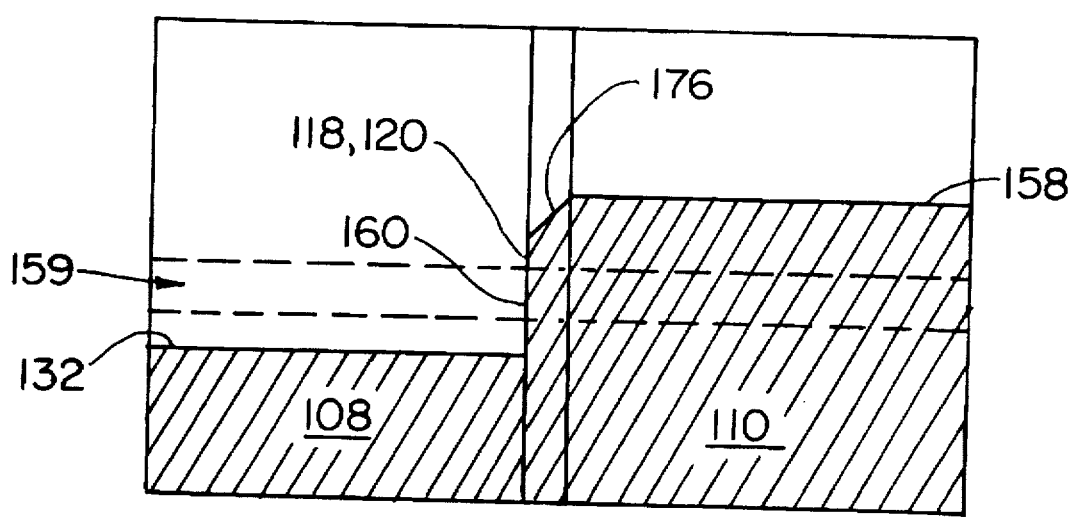
FIG. 9 shows the shadow line and the light field from the camera's perspective for a transparent substrate with a beveled edge.

As shown in FIG. 8, substrate edges 118, 120 come in a number of forms other than the right edges discussed above. Commonly, the edge of the substrate is beveled 174. FIG. 9 shows the shadow line for the substrate with beveled edge. A portion of the shadow line crossing the bevel 176 is inclined downwardly at an angle related to the angle of the bevel 174. The vertical edge of the bevel, however, still leaves a horizontal band 159 containing a portion of the substrate defined by the shadow on one side and the light on the other.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. An alignment system for a lithography system having a stage for supporting a substrate, the alignment system including a plurality of substrate edge detectors, each of the edge detectors comprising:

a projector located above the substrate, which projects a light field onto the substrate and the stage, the light field having a predetermined shadow line that is directed to extend across a respective edge of the substrate; and a camera located above the substrate, which detects an image of the light field including the shadow line;

the alignment system further including a controller that receives the light field images detected by the cameras of each of the edge detectors, locates shifts in the shadow lines caused by a height differential between the substrate and the stage, and determines a position of the substrate.

2. An alignment system as described in claim 1, wherein each of the projectors comprises:

a source of light having an aperture emitting light;

a light stop in front of the aperture that partially blocks the light from the aperture; and projection optics that form an image of an edge of the light stop onto the substrate and stage to form the shadow line.

3. An alignment system as described in claim 1, wherein optical axes of the projectors lay near or in planes that are perpendicular to the substrate and stage and contain the edges of the substrate.

4. An alignment system as described in claim 3, wherein optical axes of the projectors are shifted by small angles out of the planes.

5. An alignment system as described in claim 1, wherein each of the cameras comprises a CCD array for detecting an image of the light field.

6. An alignment system as described in claim 1, wherein an optical axis each of the cameras lays substantially in a plane that is perpendicular to the substrate and stage and contains the edge of the substrate.

7. An alignment system as described in claim 1, wherein an angle of inclination of each of the projectors is different than an angle inclination of the corresponding one of the cameras relative to the substrate and stage so that the cameras do not receive specularly reflected light from the substrate.

8. An alignment system as described in claim 1, wherein the controller identifies the shift in the shadow line by summing pixels along a direction that is orthogonal to the shadow line over a length of the shadow line to locate changes in intensity associated with the edge of the substrate.

9. A method for determining alignment of a substrate in a lithography system, comprising:

projecting light fields onto the substrate;

creating predetermined shadow lines in the light fields that extend across at least one edge of the substrate;

detecting images of the light fields; and locating the substrate by determining locations of the edge of the substrate by identifying shifts in the shadow line caused by a height differential between the substrate and a stage.

10. A method as described in claim 9, wherein the step of projecting the light fields comprises directing the light fields along directions that are near or in planes which are perpendicular to the substrate and stage and contain the edges of the substrate.

11. A method as described in claim 10, further comprising shifting an optical axis of projectors, which project the light fields, a small angle out of the plane.

12. A method as described in claim 9, further comprising projecting each of the light fields onto the substrate at a different angle then from which the light fields are detected.

13. A method as described in claim 9, wherein the step of determining a location of the edges comprises:

summing pixels of the images in a direction that is orthogonal to the shadow line; and identifying the edges in response to changes in intensity associated with the edges in the summed pixels.

14. A substrate alignment system for a lithography device, comprising:

at least three substrate edge detectors, each detector being attached to an alignment platform above the substrate and a stage, each detector comprising:

a projector that projects a light field onto the substrate and the stage, the light field having a predetermined shadow line, and a camera that detects light from the light field to generate an image of the light field; and a controller that determines a location of the substrate by reference to the images from the cameras of the edge detectors.

15. A substrate alignment system as described in claim 14, wherein the controller determines the location of the substrate by identifying shifts in the shadow lines caused by a height differential between the substrate and the stage.

16. A substrate alignment system as described in claim 14, wherein each of the projectors comprises:

a source of light having an aperture emitting light;

a light stop in front of the aperture that partially blocks the light from the aperture; and projection optics that form an image of an edge of the light stop onto the substrate and stage to form the shadow line.

17. A substrate alignment system as described in claim 14, wherein the optical axis of each projector lies near or in a plane that is perpendicular to the substrate and stage and includes an edge of the substrate.

18. A substrate alignment system as described in claim 17, wherein the optical axes of the projectors are shifted slightly out of the planes.

19. A substrate alignment system as described in claim 14, wherein optical axes of the cameras lie substantially in planes that are perpendicular to the substrate and stage and contain edges of the substrate.

20. A substrate alignment system as described in claim 14, wherein angles of inclination of the projectors are different than angles of inclination of the corresponding cameras relative to the substrate and stage so that the cameras do not receive specularly reflected light from the substrate.

* * * * *